United States Patent [19]

Tokunoh

[11] Patent Number: 4,835,119
[45] Date of Patent: May 30, 1989

[54] SEMICONDUCTOR DEVICE AND A PROCESS OF PRODUCING SAME

[75] Inventor: Futoshi Tokunoh, Itami, Japan

[73] Assignee: Mitsubishi Denki Kabushiki Kaisha, Tokyo, Japan

[21] Appl. No.: 103,042

[22] Filed: Sep. 30, 1987

Related U.S. Application Data

[62] Division of Ser. No. 711,823, Mar. 14, 1985, Pat. No. 4,719,500.

[30] Foreign Application Priority Data

Mar. 15, 1984 [JP] Japan .................................. 59-51623

[51] Int. Cl.$^4$ ............................................ H01L 29/74
[52] U.S. Cl. ..................................... 437/209; 437/212; 437/180; 437/211; 437/50; 357/55; 357/65
[58] Field of Search ................. 437/211, 212, 50, 180; 357/55, 67

[56] References Cited

U.S. PATENT DOCUMENTS

| | | | |
|---|---|---|---|
| 3,636,419 | 1/1972 | Raithel et al. | 357/79 |
| 4,358,785 | 11/1982 | Takigami et al. | 357/68 |
| 4,466,009 | 8/1984 | Konishi et al. | 357/38 |
| 4,542,398 | 9/1985 | Yatsuo et al. | 357/38 |

FOREIGN PATENT DOCUMENTS

| | | |
|---|---|---|
| 0098175 | 1/1984 | European Pat. Off. . |
| 0158749 | 12/1984 | European Pat. Off. . |
| 57-62562 | 4/1982 | Japan . |
| 148433 | 9/1983 | Japan . |
| 1278647 | 8/1968 | United Kingdom . |

Primary Examiner—Brian E. Hearn
Assistant Examiner—Beverly A. Pawlikowski
Attorney, Agent, or Firm—Birch, Stewart, Kolasch & Birch

[57] ABSTRACT

A semiconductor device which comprises: a first main electrode on a first main surface of the semiconductor substrate, and a second main electrode on a second main surface thereof, the first main surface including a control electrode; a first outer main electrode and a second outer main electrode provided on the first and second main surface, respectively, wherein the first and second outer main electrodes are respectively connected to the first main electrode and the second main electrode; an external control electrode adapted for connection to the control electrode on the semiconductor substrate; a control electrode access electrode whereby the control electrode on the substrate is connected to the external control electrode; the control electrode access electrode including a ring-shaped body having a contact section on the undersurface thereof, and a lead for connection to the external control electrode, wherein the ring-shaped body is covered with an insulating film in the portion excluding the contact section, and wherein the ring-shaped body is kept in contact with the control electrode on the semiconductor substrate at the contact section.

20 Claims, 4 Drawing Sheets

SEMICONDUCTOR DEVICE AND A PROCESS OF PRODUCING SAME

This application is a divisional of copending application Ser. No. 711,823, filed on Mar. 14, 1985, U.S. Pat. No. 4,719,500.

FIELD OF THE INVENTION

The present invention relates to a semiconductor device and a process of producing the same, wherein the semiconductor device has a ring-shaped control electrode, and a control electrode access electrode for an external control electrode.

BACKGROUND OF THE INVENTION

In gate turn-off thyristors and transistors of large capacity a high current flows through the control electrode (the gate or the base) in accordance with an increase in capacity; in recent models in commerce tens to a few hundred amperes of current flows. Particularly, in gate turn-off thyristors of large capacity a large gate reverse current is required at the time of turn-off. In addition, it is essential to ensure that the current flows evenly and instantaneously. Therefore it has been proposed that the impedance between the gate and the cathode be minimized. For example, the shape of the access portion for the gate is shaped like a ring, thereby shortening the distance from the access portion up to the emitter region, equalizing the current distribution, and reducing the current.

To explain the background of the invention, reference will be more particularly made to FIG. 1, which shows an example of a conventional semiconductor device. FIG. 1 illustrates a pattern in a plane view of a gate turn-off thyristor element having a ring-shaped gate structure, and FIG. 2 shows a cross-section thereof. The reference numerals 1, 1a, 1b, 1c, and 1d designate a thyristor element, a silicon wafer, a reinforcing plate of molybdenum having the wafer 1a soldered thereto (the pewter being designated by 1g), a gate electrode, and a cathode electrode, respectively. Both of the reference numerals 1e and 1f designate current collecting portions of the gate.

In this example the gate electrode 1c and an external gate electrode (not shown) are directly interconnected to each other through wiring. FIG. 3 is a perspective view showing an access structure for the gate electrode, and FIG. 4 is a cross-section thereof. The reference numeral 2 designates an aluminum wire, which normally has a diameter of 0.3 to 0.7 mm. It is necessary to fix or bond the aluminum wire 2 at several points along the ring-shaped current collecting portion of the gate 1e so as to equalize the distribution of the gate current, wherein the intervals therebetween are preferably equal.

In addition, in such large-capacity gate turn-off thyristors the common practice is to insert a plate between the cathode electrode 1d and an external cathode (not shown) so as to minimize heat stress. The plate is made of molybdenum, tungsten or the like, which has approximately the same thermal expansivity coefficient as that of silicon. It is also essential to fix the plate at an exact position with respect to the cathode electrode 1d. To this end it is necessary to adhere the plate on the cathode electrode 1d of the thyristor element 1 with a special adhesive, such as a heat-proof high molecular substance. As a result, under the conventional practice the assembly process requires much manual labor, which unfavorably reflects in the production efficiency and the price. In addition, the wire bonding portion is likely to break or to be damaged due to mechanical stress or heat stress occurring in the heating cycle.

Furthermore, under the conventional method the electrical resistance of the wire itself must be taken into consideration, otherwise it would prevent discharging of carriers from the gate when the main current is cut off, particularly when a few hundred amperes of current flows. This often leads to reduction of the controllable current of the gate turn-off thyristor.

Another example of the conventional gate electrode structure employing the same wire bonding as that in the above-mentioned example is disclosed in Japanese Patent Laid-Open (Kokai) No. 53-95583. This gate turn-off thyristor has a gate lead directly bonded to both the semiconductor element and the external electrode. This prior art has the same disadvantages as those of the above-mentioned example.

As the capacity of gate turn-off thyristors becomes large, the diameter of the elements increases, and this makes it necessary to lengthen the wirings for bonding. At the same time the gate current required at the time of cut-off also increases, and this makes it necessary to reduce the resistance in the wirings to a greater extent.

In order to supply sufficient current to the gate by reducing the resistance in the wirings, it is the common practice to keep the gate access electrode in contact with the element. This method is effective in a center gate thyristor where the gate is located at the center of the element, and in a large-capacity transistor.

FIG. 5 is a cross-section showing the thyristor constructed so as to keep the gate access electrode in pressure-contact with the thyristor element, which is disclosed in Japanese Patent Laid-Open (Kokai) No. 57-62562. This disclosed semiconductor device includes a thyristor element 1, an inserted plate 3, an outer cathode electrode 4, a gate access lead 5, an insulating support 6 whereby the gate access lead 5 and the inserted plate 3 are exactly positioned with respect to the outer cathode electrode 4, a spring 7 whereby the top portion 5a of the gate access lead 5 is kept in pressure-contact with the thyristor element 1 through the insulating support 6, a protection pipe 8 whereby the gate access lead 5 is insulated from the outer cathode electrode 4, an outer anode electrode 9, a ceramic cylinder 10 for supporting the thyristor element 1, a cathode-side flange 11 for fixing the outer cathode electrode 4 to the ceramic cylinder 10, an anode-side flange 12 for fixing the outer anode electrode 9 to the ceramic cylinder 10, and an outer gate electrode 13.

In this example it is not necessary to bond the gate access electrode and the gate access wire together, which makes it possible to use a wire having a large diameter, and a wire made of a more conductive substance than aluminium, such as silver. This is particularly advantageous for supplying a high current.

However, since the insulating support 6 must be made of sintered alumina or the like, it is difficult to produce it to exact dimensions, which necessitates relatively large clearances between the outer cathode electrode 4 and the insulating support 6, and between the insulating support 6 and the gate access lead 5. This leads to the inexact positioning. Owing to this drawback this gate access structure is not applicable to the gate turn-off thyristors which require highly exact positioning.

There is still a further example for ring-shaped gate turn-off thyristors disclosed in Japanese Patent Laid-Open (Kokai) No. 58-148433. The disclosed prior art adopts the electrode pressure-contact system, characterized in that a gate ring, divided into several sections, is kept in contact with the ring gate. However, in this example the gate lead is supported by an insulating support of ceramic or the like, which leads to the inexact positioning as pointed out with respect to the above-mentioned example.

In the second example mentioned above it is necessary to provide a gate access lead 5 having a ring-shaped-top portion 5a which is to be kept in pressure-contact with the thyristor element 1; in fact, however, pressure-contact type gates securing an easy and exact positioning of the ring-shaped top portion have not materialized.

OBJECTS AND SUMMARY OF THE INVENTION

The present invention is directed to solve the difficulties and problems pointed out above, and has for its object to provide a semiconductor device, and a process of producing the same, capable of obtaining an access for the control electrode while securing an easy and exact positioning of the control electrode access electrode, and also enhancing the reliability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is provided a semiconductor device which comprises:

a first main electrode on a first main surface of the semiconductor substrate, and a second main electrode on a second main surface thereof, the first main surface including a control electrode;

a first outer electrode and a second main electrode provided on the first and second main surface, respectively, wherein the first and second outer electrodes are respectively connected to the first main electrode and the second electrode;

an external control electrode adapted for connection to the control electrode on the semiconductor substrate;

An access electrode whereby the control electrode on the substrate is connected to the external control electrode;

the access electrode including a ring-shaped body having a contact section on the undersurface thereof, and a lead for connection to the external control electrode, wherein the ring-shaped body is covered with an insulating film in the portion excluding the contact section, and wherein the ring-shaped body is kept in contact with the control electrode on the semiconductor substrate at the contact section.

According to another aspect of the present invention, there is provided a process of producing a control electrode access electrode for connecting the control electrode on the semiconductor substrate to an external control electrode, the process comprising the steps:

forming a ring-shaped access electrode body;

producing an insulating film over that portion of the access electrode body which excludes a contact section at which the access electrode body is kept in contact with the control electrode on the semiconductor substrate, and a lead connecting section at which a lead for connection to the external control electrode is connected to the access electrode body; and connecting the lead for connection to the external control electrode to the lead connecting section of the access electrode body.

According to a further aspect of the present invention, there is provided a process of producing a control electrode access electrode for connecting the control electrode on the semiconductor substrate to an external control electrode, the process comprising the steps:

forming a ring-shaped access electrode body;

connecting a lead for connection to the external control electrode to the lead connecting section of the access electrode body; and producing an insulating film over that portion of the access electrode body and the lead for connection to the external control electrode which portion excludes a contact section at which the access electrode body is kept in contact with the control electrode on the semiconductor substrate.

DETAILED DESCRIPTION OF THE PREFERRED EMBODIMENTS

Figure 7:
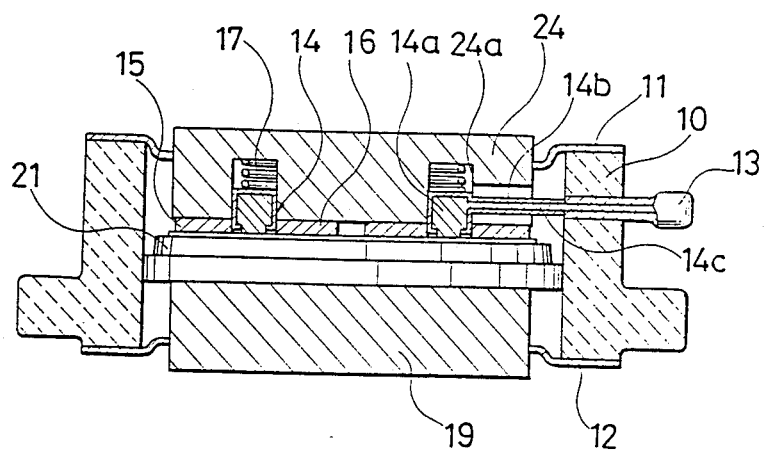
FIG. 7 is a cross-section showing the gate turn-off thyristor of the first embodiment of the present invention.

Referring to FIG. 7, a large capacity gate turn-off thyristor as a first embodiment of the present invention will be described:

The reference numeral 21 designates a semiconductor substrate as a thyristor element. The thyristor element 21 has a first main surface (the top surface in FIG. 7) on which a cathode electrode as a first main electrode and a gate electrode as a control electrode are formed, and a second main surface (the undersurface in FIG. 7) on which an anode electrode as a second main electrode is formed. The reference numeral 15 designates an outer plate inserted between the peripheral portion of the cathode electrode of the thyristor element 21, and an outer cathode electrode 24 which is a first outer main electrode. The reference numeral 16 designates an inner plate inserted between the inner portion of the cathode electrode of the thyristor element 21, and the outer cathode electrode 24. The outer cathode electrode 24 is provided with a ring-shaped groove 24a produced on its first main surface, the groove 24a containing a ring-shaped gate access electrode 14 in such a manner that it is free in the vertical direction. The gate access electrode 14 is spring-loaded toward the gate electrode of the thyristor element 21 by means of a spring 17 inserted between the access electrode 14 and the bottom of the groove 24a, so as to keep contact therewith.

Figure 1:
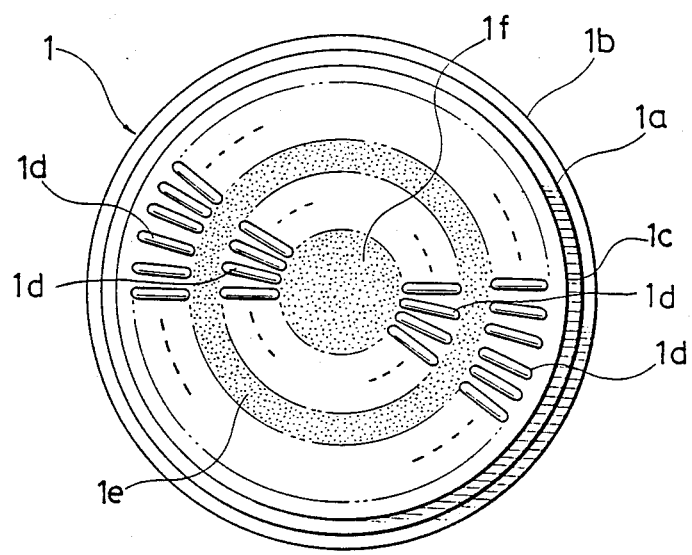
FIG. 1 is a plan view showing a gate turn-off thyristor having a ring-shaped gate structure.
Figure 2:
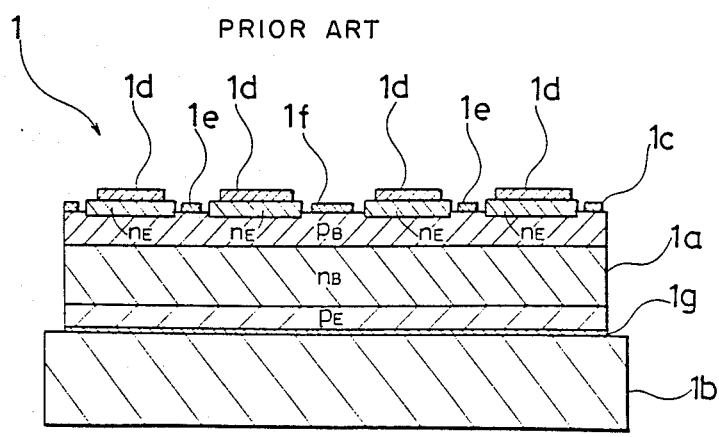
FIG. 2 is a cross-section of the thyristor shown in FIG. 1.
Figure 3:
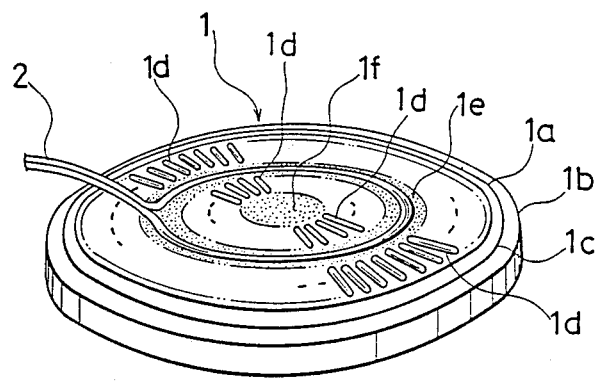
FIG. 3 is a perspective view showing a known gate turn-off thyristor in which a wire bonding for gate access is conducted.
Figure 4:
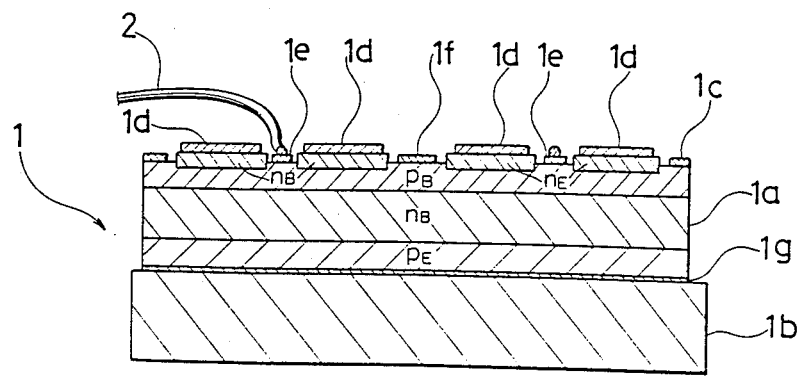
FIG. 4 is a cross-section of the thyristor shown in FIG. 3.
Figure 5:
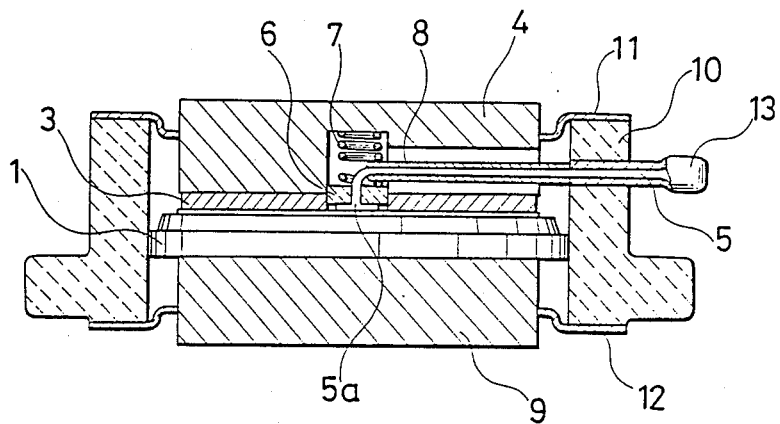
FIG. 5 is a cross-section showing a known center-gate-pressure-contact type thyristor.
Figure 6:
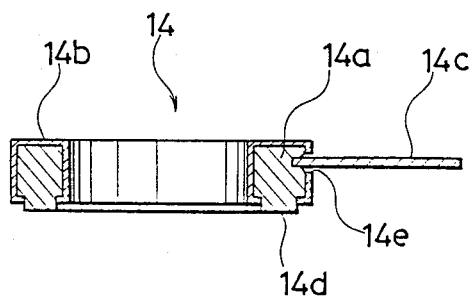
FIG. 6 is a cross-section showing a gate access electrode for a gate turn-off thyristor as a first embodiment of the present invention.

FIG. 6 shows the structure of the gate access electrode 14, which includes a ring-shaped metal portion 14a as the main body, a contact portion 14d protruded along the ring-shaped undersurface of the ring-shaped metal portion 14a, the contact portion 14d being adapted to keep in pressure-contact with the thyristor element 21, a wire portion 14c soldered to a soldering portion 14e of the metal portion 14a, the wire portion 14c functioning as a control lead, wherein all the portion except for the contact portion 14d and the soldering portion 14e are covered with an insulating film 14b. In this embodiment the wire portion 14c is fixed to the metal portion 14a after the insulating film 14b is formed, but it is possible to fix the wire portion 14c before the insulating film 14b is formed.

In operation, the gate turn-off thyristor of the invention has a relatively large cross-sectional area in its metal portion 14a, which results in having a small resistance. In addition, since the wire portion 14c has a relatively large diameter, the potential drop in the gate access electrode 14 is minimized. As a result, the current distribution is equalized, thereby enhancing the cut-off efficiency of the gate turn-off thyristor. In the present invention it is not necessary to conduct a wire bonding, thereby eliminating the worry about the problems of bond-break or wire-breakage.

The gate access electrode 14 of the invention functions as an insulating support and a gate access wiring in the conventional gate contact structure, thereby eliminating the necessity of interlinking them as practised under the known structure. This leads to increased working efficiency. In addition, in the present invention the positioning accuracy for the gate access electrode 14 is determined by the metal portion 14a made to a highly precise dimension. This overcomes the difficulty of exact positioning that exists in the conventional structure.

Figure 8:
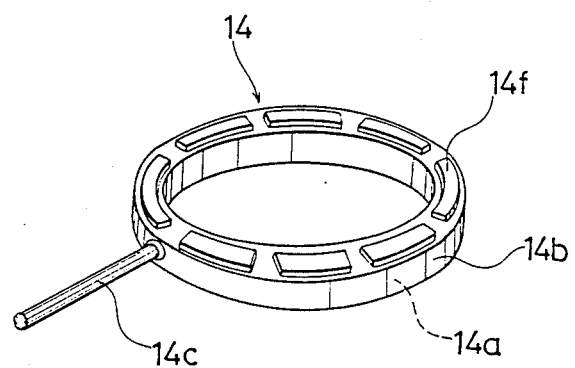
FIG. 8 is a perspective view showing a gate access electrode of a second embodiment of the present invention which is an alternative to the gate access electrode shown in FIG. 6.

FIG. 8 shows a second embodiment which is an alternative of the gate access electrode device in FIG. 6, which has contact sections 14f by which it keeps pressure-contact with the thyristor element 21. As shown in FIG. 8, the contact sections 14f are located along the ring-shaped undersurface of the ring-shaped metal portion 14a, the contact sections 14f being individually shaped like an arc. Under this embodiment the contact pressure per unit area of the contact sections 14f can be adequately adjusted by varying the lengths of the arc-shaped contact sections 4f.

A process of producing the gate access electrode of the first embodiment will be described:

(1) The ring-shaped metal portion 14a is formed to a desired precise dimension, and the contact section 14d and the soldering portion 14e for connection to the wire portion 14c are subjected to masking treatment. Then alumina or boron nitride is formed on the metal portion 14a by an injection technique thereby producing an insulating film 14b thereon. When the metal portion 14a is made of copper, and when the alumina is formed thereon, it is possible to produce the insulating film 14b having a thickness of about 500 μm. When the mechanical strength, the electrical insulating ability and the dimensional accuracy of the insulating film are taken into consideration, the thickness is preferably in the range of 100 to 300 μm;

(2) The wire portion 14c is soldered to the soldering portion 14e of the filmed metal portion 14a. In this way the gate access electrode 14 is obtained. It is preferred that the wire portion 14c is made of pure silver (99.99%), and the soldering is carried out in hydrogen with the use of a silver-copper pewter; and (3) In order to reduce the contact resistance with the thyristor element 21, it is preferred that the contact section 14d is silver-plated to a thickness of 5 to 10 μm subsequently to the soldering process, and annealing of the silver-plating portion is carried out for 30 to 60 min.

In the foregoing description reference has been made only to a gate turn-off thyristor, but the present invention can be applied to a semiconductor device of a large capacity having ring-shaped control electrodes, such as a high power transistor or a gate-supplementing turn-off thyristor. In such cases the same results are obtained. In addition, the present invention can be applied to the gate access electrodes of the conventional center gate structure, thereby enhancing the working efficiency and the positioning accuracy.

As evident from the foregoing description, the semiconductor device of the invention is advantageous in that it has a gate access electrode easy to assemble. In addition, the high reliability and precision in gate access are achieved in the semiconductor substrate having a ring-shaped gate. Furthermore, the gate access electrode can be produced by a simplified process.

What is claimed is:

1. A process of producing a semiconductor device having an access electrode for connecting a substrate control electrode of a semiconductor substrate to an external control electrode, said process comprising the following steps:

forming a ring-shaped access electrode body;

producing an insulating film over that portion of said access electrode body which excludes a contact section at which said access electrode body contacts said substrate control electrode of said semiconductor substrate, and which excludes a lead connecting section at which a lead for connection to said external control electrode is connected to said access electrode body;

connecting said lead for connection to said external control electrode to said lead connecting section of said access electrode body;

positioning said access electrode body in a ring-shaped groove so that said contact section of said access electrode is in contact with said semiconductor substrate; and disposing a spring against said access electrode body so as to provide for pressure contact between said contact section and said semiconductor substrate.

2. A process as set forth in clam 1, wherein said lead for connection to said external control electrode is made of pure silver, and wherein said lead is connected to said lead connecting section by soldering in hydrogen with a silver-copper pewter.

3. A process of producing a semiconductor device having an access electrode for connecting a substrate control electrode of a semiconductor substrate to an external control electrode, said process comprising the following steps:

forming a ring-shaped access electrode body;

connecting a lead for connection to said external control electrode to said external control electrode to a lead connecting section of said access electrode body;

producing an insulating film over that portion of said access electrode body and said lead for connection to said external control electrode, which portion excludes a contact section at which said access electrode body contacts said substrate control electrode of said semiconductor substrate;

positioning said access electrode body in a ring-shaped groove so that said contact section of said access electrode is in contact with said semiconductor substrate; and disposing a spring against said access electrode body so as to provide for pressure contact between said contact section and said semiconductor substrate.

4. A process as set forth in claim 3, wherein said lead for connection to said external control electrode is made of pure silver, and wherein said lead is connected to said lead connecting section by soldering in hydrogen with a silver-copper pewter.

5. A process as set forth in claim 1, wherein said contact section and said lead connecting section are masked before said insulating film is formed on said access electrode body, and wherein said contact section is silver-plated.

6. A process as set forth in claim 3, wherein said contact section and said lead connecting section are masked before said insulating film is formed on said access electrode body, and wherein said contact section is silver-plated.

7. A process as set forth in claim 1, wherein said access electrode body is formed of copper or aluminum and said insulating film is formed of alumina or boron nitride having a thickness of about 500 microns.

8. A process as set forth in claim 3, wherein said access electrode body is formed of copper or aluminum and said insulating film is formed of alumina or boron nitride having a thickness of about 500 microns.

9. A process as set forth in claim 1, wherein said insulating film has a thickness in the range of 100 to 300 microns, and wherein said contact section is silver-plated to a thickness of from 5 to 10 microns by annealing.

10. A process as set forth in claim 3, wherein said insulating film has a thickness in the range of 100 to 300 microns, and wherein said contact section is silver-plated to a thickness of from 5 to 10 microns by annealing.

11. A process as set forth in claim 2, wherein said contact section and said lead connecting section are masked before said insulating film is formed on said access electrode body, and wherein said contact section is silver-plated.

12. A process as set forth in claim 4, wherein said contact section and said lead connecting section are masked before said insulating film is formed on said access electrode body, and wherein said contact section is silver-plated.

13. A process as set forth in claim 11, wherein said access electrode body is formed of copper or aluminum and said insulating film is formed of alumina or boron nitride having a thickness of about 500 microns.

14. A process as set forth in claim 12, wherein said access electrode body is formed of copper or aluminum and said insulating film is formed of alumina or boron nitride having a thickness of about 500 microns.

15. A process as set forth in claim 13, wherein said insulating film has a thickness in the range of 100 to 300 microns, and wherein said contact section is silver-plated to a thickness of from 5 to 10 microns by annealing.

16. A process as set forth in claim 14, wherein said insulating film has a thickness in the range of 100 to 300 microns, and wherein said contact section is silver-plated to a thickness of from 5 to 10 microns by annealing.

17. A process as set forth in claim 1, wherein said contact section comprises a plurality of arc-shaped portions.

18. A process as set forth in claim 3, wherein aid contact section comprises a plurality of arc-shaped portions.

19. A process as set forth in claim 15, wherein said contact section comprises a plurality of arc-shaped portions.

20. A process as set forth in claim 16, wherein said contact section comprises a plurality of arc-shaped portions.

* * * * *